United States Patent
Lee

(10) Patent No.: US 10,685,719 B2
(45) Date of Patent: Jun. 16, 2020

(54) MEMORY DEVICE AND OPERATION METHOD THEREOF

(71) Applicant: SK hynix Inc., Gyeonggi-do (KR)

(72) Inventor: Hyun-Woo Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/223,656

(22) Filed: Dec. 18, 2018

(65) Prior Publication Data
US 2019/0371412 A1 Dec. 5, 2019

(30) Foreign Application Priority Data

May 31, 2018 (KR) .................. 10-2018-0062518

(51) Int. Cl.
| | |
|---|---|
| *G11C 16/26* | (2006.01) |
| *G11C 16/10* | (2006.01) |
| *G06F 3/06* | (2006.01) |
| *G11C 7/04* | (2006.01) |

(52) U.S. Cl.
CPC ............ *G11C 16/26* (2013.01); *G06F 3/0619* (2013.01); *G06F 3/0653* (2013.01); *G11C 7/04* (2013.01); *G11C 16/10* (2013.01); *G06F 3/0679* (2013.01)

(58) Field of Classification Search
CPC .......... G11C 16/26; G11C 7/04; G11C 16/10; G06F 3/0619; G06F 3/0653
USPC .......................................... 365/189.01–225.7
See application file for complete search history.

(56) References Cited

U.S. PATENT DOCUMENTS

| | | | |
|---|---|---|---|
| 9,666,249 B1 * | 5/2017 | Park .................... | G11C 7/04 |
| 9,891,859 B1 | 2/2018 | Vogan et al. | |
| 10,198,214 B2 * | 2/2019 | Kim ................. | G06F 3/0679 |
| 2015/0301744 A1 * | 10/2015 | Kim ................. | G06F 3/0679 |
| | | | 711/103 |
| 2017/0097790 A1 * | 4/2017 | Doo .................... | G06F 3/061 |

FOREIGN PATENT DOCUMENTS

| | | |
|---|---|---|
| KR | 101318508 | 10/2013 |
| KR | 1020160033147 | 3/2016 |
| KR | 1020170111375 | 10/2017 |

* cited by examiner

*Primary Examiner* — Harry W Byrne
(74) *Attorney, Agent, or Firm* — IP & T Group LLP

(57) ABSTRACT

A method for operating a memory device includes: receiving a program command, a memory address, and a program data from a controller; performing a first temperature sensing operation for measuring an internal temperature to produce a first result of the first temperature sensing operation; performing a program operation on the program data based on the first result of the first temperature sensing operation; performing a second temperature sensing operation for measuring an internal temperature to produce a first result of the second temperature sensing operation; and performing a temperature comparison operation for deciding whether the program operation failed when a difference between the first result of the first temperature sensing operation and the first result of the second temperature sensing operation is greater than or equal to a threshold value.

6 Claims, 13 Drawing Sheets

ND OPERATION METHOD THEREOF

MEMORY DEVICE AND OPERATION METHOD THEREOF

CROSS-REFERENCE TO RELATED APPLICATION

The present application claims priority under 35 U.S.C. § 119(a) to Korean Patent Application No. 10-2018-0062518, filed on May 31, 2018, which is incorporated herein by reference in its entirety.

BACKGROUND

1. Field

Various embodiments of the present invention relate to a memory device, and more particularly, to a non-volatile memory device and a method for operating the memory device.

2. Description of the Related Art

The emerging computer environment paradigm is ubiquitous computing, that is, computing systems that can be used anytime and anywhere. As a result, use of portable electronic devices such as mobile phones, digital cameras, and notebook computers has rapidly increased. These portable electronic devices generally use a memory system having one or more memory devices for storing data. A memory system in such device may be used as a main memory device or an auxiliary memory device.

Memory systems provide excellent stability, durability, high information access speed, and low power consumption since they have no moving parts. Examples of memory systems having such advantages include universal serial bus (USB) memory devices, memory cards having various interfaces, and solid state drives (SSDs).

SUMMARY

Embodiments of the present invention are directed to a memory device capable of improving the reliability of stored data even when an internal thermo-sensor malfunctions, and a method for operating the memory device.

In accordance with an embodiment of the present invention, a method for operating a memory device includes: receiving a program command, a memory address, and a program data from a controller; performing a first temperature sensing operation for measuring an internal temperature to produce a first result of the first temperature sensing operation; performing a program operation on the program data based on the first result of the first temperature sensing operation; performing a second temperature sensing operation for measuring an internal temperature to produce a first result of the second temperature sensing operation; and performing a temperature comparison operation for deciding whether of the program operation failed when a difference between the first result of the first temperature sensing operation and the first result of the second temperature sensing operation is greater than or equal to a threshold value.

In accordance with another embodiment of the present invention, a method for operating a memory device includes: receiving a program command, a memory address, and a program data from a controller; performing a first temperature sensing operation for measuring an internal temperature to produce a first result of the first temperature sensing operation; performing a second temperature sensing operation for measuring an internal temperature to produce a first result of the second temperature sensing operation, while performing a program operation on the program data received from the controller based on the first result of the first temperature sensing operation; and performing a temperature comparison operation for deciding whether the program operation failed when a difference between the first result of the first temperature sensing operation and the first result of the second temperature sensing operation is greater than or equal to a threshold value.

In accordance with yet another embodiment of the present invention, a memory device includes: a temperature sensor suitable for performing a first temperature sensing operation and a second temperature sensing operation for measuring an internal temperature to produce a first result of the first temperature sensing operation and a first result of the second temperature sensing operation, respectively, when the memory device receives a program command, a memory address, and a program data from a controller; a program component suitable for performing a program operation on the program data based on the first result of the first temperature sensing operation to produce a result of the program operation; and a temperature comperator suitable for performing a temperature comparison operation for deciding whether of the program operation failed, when a difference between the first result of the first temperature sensing operation and the first result of the second temperature sensing operation is greater than or equal to a threshold value.

In accordance with still another embodiment of the present invention, a memory system comprising: a memory device including a plurality of memory blocks and a temperature sensor; and a controller configured to control the memory device to perform a program operation, wherein the memory device configured to: measure a first temperature using the temperature sensor, perform the program operation for a memory block selected from among the plurality of memory blocks; measure a second temperature using the temperature sensor, and when the difference between the first temperature and the second temperature is greater than a threshold value, transfer, to the controller, a signal to re-preform the program operation.

DETAILED DESCRIPTION

Figure 1:
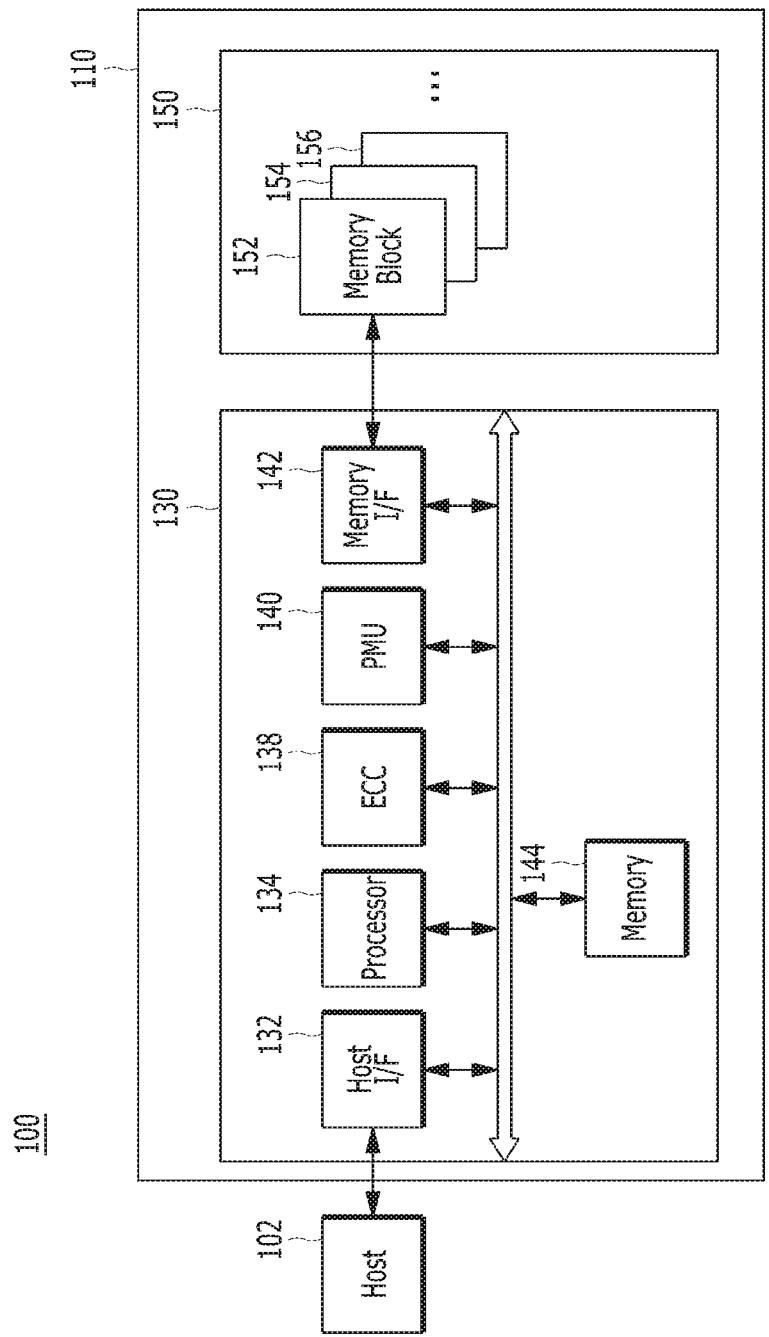
FIG. 1 is a block diagram illustrating a data processing system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the specification, reference to "an embodiment," "another embodiment" or the like is not necessarily to only one embodiment, and different references to any such phrase are not necessarily to the same embodiment(s).

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, an MP3 player and a laptop computer, or any of various non-portable electronic devices such as a desktop computer, a game machine, a television (TV), and a projector.

The host 102 may include at least one operating system (OS), which may manage and control overall functions and operations of the host 102, and provide operation between the host 102 and a user using the data processing system 100 or the memory system 110. The OS may support various functions and operations corresponding to the use(s) and application(s) of the host 102. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. The mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC), micro-MMC, and the like. The SD card may include a mini-SD card and micro-SD card.

The memory system 110 may be implemented by any of various types of storage devices. Examples of such storage devices include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory. The flash memory may have a 3-dimensional (3D) stack structure.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in any of the various types of memory systems exemplified above. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card such as a personal computer memory card international association (PCMCIA) card, a compact flash (CF) card, a smart media card (SMC), a memory stick, a multimedia card (MMC) including a reduced size MMC (RS-MMC) and a micro-MMC, a secure digital (SD) card including mini-SD, micro-SD and SD High Capacity (SDHC), or a universal flash storage (UFS) device.

Non-limiting application examples of the memory system 110 include a computer, an ultra mobile PC (UMPC), a workstation, a net-book, a personal digital assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152, 154, 156 . . . , each of which may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of this aspect is omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a power management unit (PMU) 140, a memory interface (I/F) 142 (or a NAND flash controller (NFC)), and a memory 144 all operatively coupled via an internal bus.

The host interface 132 may be configured to process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC component 138 may detect and correct an error contained in the data read from the memory device 150. In other words, the ECC component 138 may perform an error correction decoding process on the data read from the memory device 150 through an ECC code used during an ECC encoding process. According to a result of the error correction decoding process, the ECC component 138 may output a signal, for example, an error correction success/fail signal. When the number of error bits is greater than a threshold value of correctable error bits, the ECC component 138 may not correct the error bits, and instead may output an error correction fail signal.

The ECC component 138 may perform error correction through a coded modulation such as a low density parity check (LDPC) code, a Bose-Chaudhri-Hocquenghem (BCH) code, a turbo code, a Reed-Solomon (RS) code, a convolution code, a recursive systematic code (RSC), a trellis-coded modulation (TCM) and a block coded modulation (BCM). However, the ECC component 138 is not limited to any specific structure. The ECC component 138 may include all circuits, modules, systems or devices for error correction.

The PMU 140 may provide and manage power of the controller 130.

The memory I/F 142 may serve as a memory or storage interface for interfacing the controller 130 and the memory device 150 such that the controller 130 controls the memory device 150 in response to a request from the host 102. When the memory device 150 is a flash memory, (specifically a NAND flash memory), the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by a static random access memory (SRAM) or dynamic random access memory (DRAM). The memory 144 may be disposed within or externally to the controller 130. FIG. 1 shows the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). The processor 134 may be implemented as a microprocessor or a central processing unit (CPU).

For example, the controller 130 may perform an operation requested by the host 102 in the memory device 150 through the processor 134, which is implemented as a microprocessor or a CPU. In other words, the controller 130 may perform a command operation corresponding to a command received from the host 102, or other source. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

The controller 130 may perform a background operation onto the memory device 150 through the processor 134, which is implemented as a microprocessor or a CPU. The background operation performed onto the memory device 150 may include an operation of copying and processing data stored in some memory blocks among the memory blocks 152 to 156 into other memory blocks, e.g., a garbage collection (GC) operation, an operation of swapping between the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
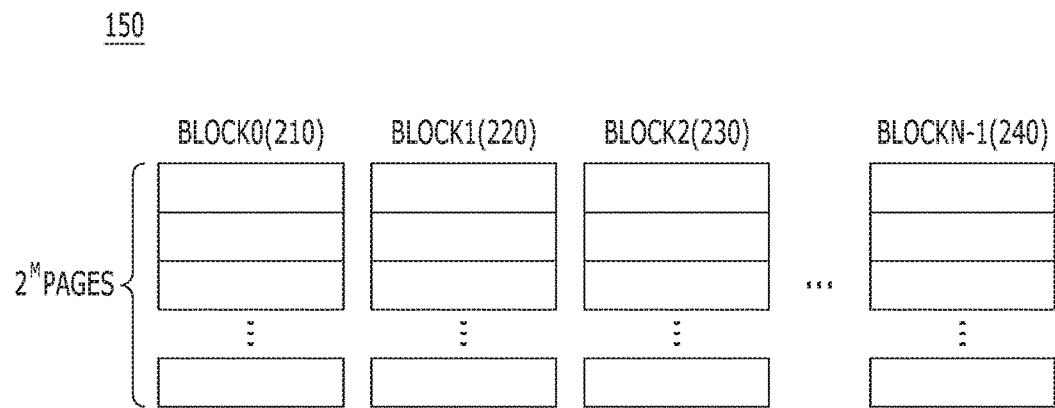
FIG. 2 is a schematic diagram illustrating an exemplary configuration of blocks of a memory device employed in a memory system of FIG. 1.

FIG. 2 is a schematic diagram illustrating a memory device, e.g., the memory device 150 of FIG. 1, in accordance with an embodiment of the present invention. FIG. 3 is a circuit diagram illustrating an exemplary configuration of a memory cell array of a memory block in the memory device 150. FIG. 4 is a schematic diagram illustrating an exemplary three-dimensional (3D) structure of the memory device 150.

Referring to FIG. 2, the memory device 150 may include a plurality of memory blocks 0 to N−1, e.g., a memory block 0 (BLK0) 210, a memory block 1 (BLK1) 220, a memory block 2 (BLK2) 230, and a memory block N−1 (BLKN−1) 240. Each of the memory blocks 210, 220, 230 and 240 may include a plurality of pages, for example $2^M$ pages, the number of which may vary according to circuit design. For example, in some applications, each of the memory blocks may include M pages. Each of the pages may include a plurality of memory cells that are coupled to a plurality of word lines WL.

The memory device 150 may include a plurality of memory blocks, which may include a single level cell (SLC) memory block storing 1-bit data and/or a multi-level cell (MLC) memory block storing 2-bit data. The SLC memory blocks may include a plurality of pages that are realized by memory cells storing one-bit data in one memory cell. The SLC memory blocks may have quick data operation performance and high durability. On the other hand, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. Particularly, the memory device 150 may include not only the MLC memory blocks, each of which includes a plurality of pages that are realized by memory cells capable of storing two-bit data in one memory cell, but also triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or multiple level cell memory blocks each of which includes a plurality of pages that are realized by memory cells capable of storing five or more-bit data in one memory cell.

In accordance with an embodiment of the present invention, the memory device 150 is described as a non-volatile memory, such as a flash memory, e.g., a NAND flash memory. However, the memory device 150 may be realized as any of a phase change random access memory (PCRAM), a resistive random access memory (RRAM or ReRAM), a ferroelectric random access memory (FRAM), a spin transfer torque magnetic random access memory (STT-RAM or STT-MRAM).

The memory blocks 210, 220, 230 and 240 may store the data transferred from the host 102 through a program operation, and transfer data stored therein to the host 102 through a read operation.

Figure 3:
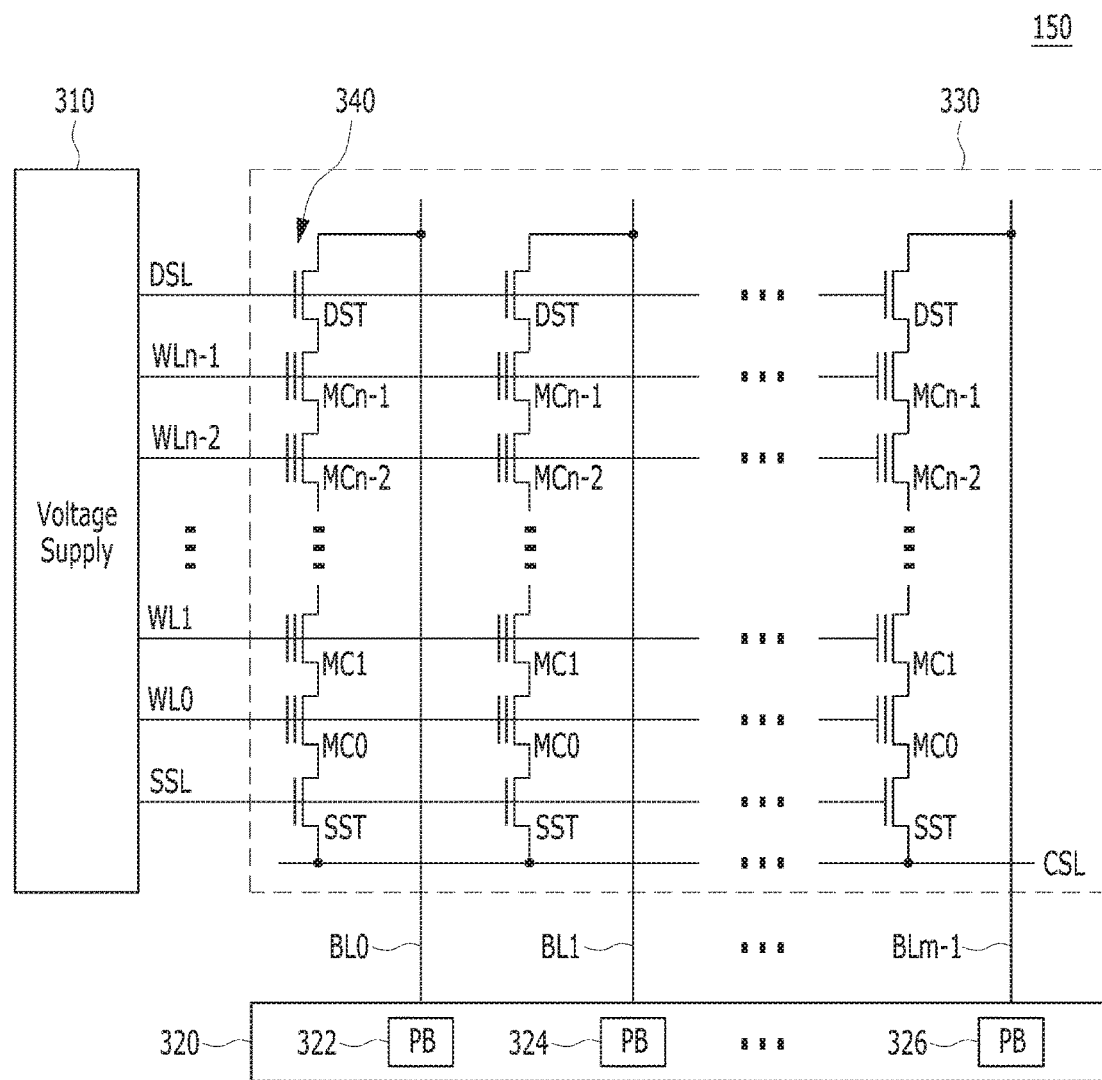
FIG. 3 is a circuit diagram illustrating an exemplary configuration of a memory cell array of a memory block in a memory device shown in FIG. 1.
Figure 4:
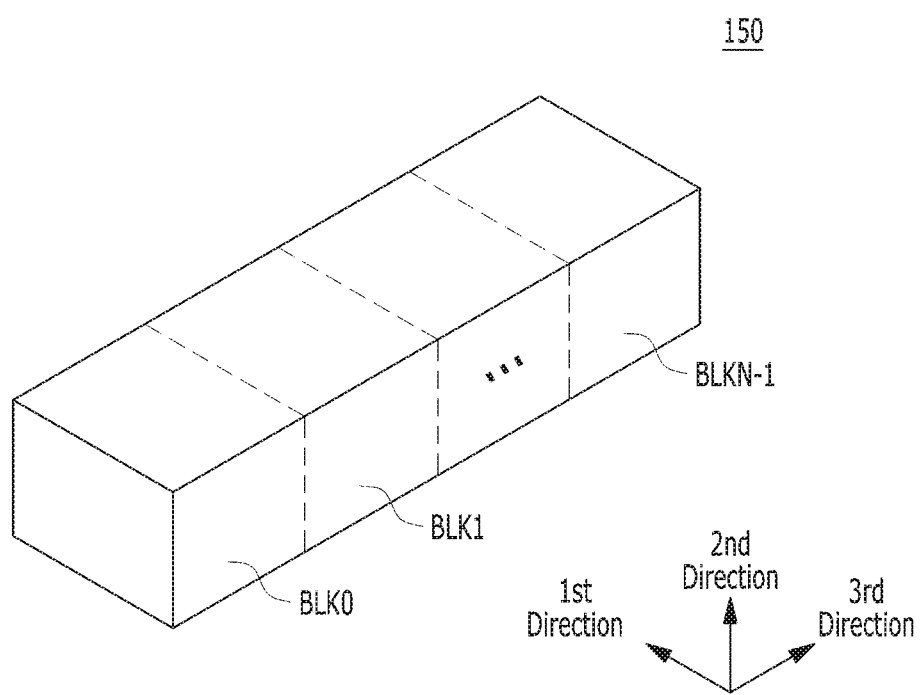
FIG. 4 is a schematic diagram illustrating an exemplary three-dimensional (3D) structure of the memory device of FIG. 2.

Referring to FIG. 3, a memory block 330 may correspond to any of the plurality of memory blocks 152 to 156 included in the memory device 150 of the memory system 110. The memory block 330 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310, which may provide word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers (PBs) 322 to 326 respectively corresponding to columns (or bit lines) or column pairs (or bit line pairs). Each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. FIG. 4 illustrates the memory blocks 152 to 156 of the memory device 150 shown in FIG. 1. Each of the memory blocks 152 to 156 may be realized in a 3D structure (or vertical structure). For example, the memory blocks 152 to 156 may be a three-dimensional structure with dimensions extending in first to third directions, e.g., an x-axis direction, a y-axis direction, and a z-axis direction.

Each memory block 330 in the memory device 150 may include a plurality of NAND strings NS that extend in the second direction, and a plurality of NAND strings NS that extend in the first direction and the third direction. Each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block 330, among the memory blocks 152 to 156, may be coupled to a plurality of bit lines BL, a plurality of string selection lines SSL, a plurality of ground selection lines GSL, a plurality of word lines WL, a plurality of dummy word lines DWL, and a plurality of common source lines CSL. Each memory block 330 may include a plurality of NAND strings NS. In each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Memory cells MC may be provided between the string selection transistor SST and the ground selection transistor GST of each NAND string NS. In other words, a plurality of memory cells may be realized in each memory block 330 of the memory blocks 152 to 156 of the memory device 150. A data processing operation toward a memory device, particularly, a data processing operation performed when a plurality of command operations corresponding to a plurality of commands are performed, in a memory system in accordance with an embodiment of the present invention is described in detail with reference to FIGS. 5 to 6D.

Figure 5:
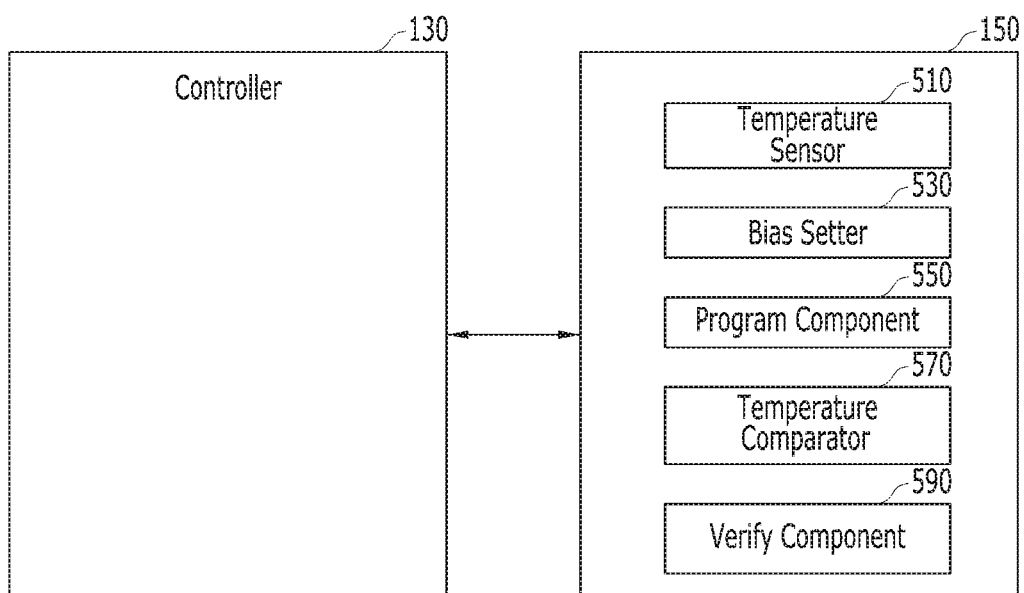
FIG. 5 is a block diagram illustrating a structure of a memory system in accordance with an embodiment of the present invention.

FIG. 5 is a block diagram illustrating a structure of a memory system in accordance with an embodiment of the present invention.

Referring to FIG. 5, the controller 130 and the memory device 150 of FIG. 5 may correspond to those described in FIG. 1. The memory device 150 may include a temperature sensor 510, a bias setter 530, a program component 550, a temperature comparator 570 and a verify component 590.

The temperature sensor 510 may perform a first temperature sensing operation and a second temperature sensing operation. The first temperature sensing operation measures the temperature of the memory device 150 in order to decide a program voltage and a verify voltage. The second temperature sensing operation measures the temperature of the memory device 150 in order to verify whether the result of the first temperature sensing operation is accurate or not.

The bias setter 530 may set bias voltages based on the result of the first temperature sensing operation. In other words, the bias setter 530 may decide the program voltage and the verify voltage to be applied based on the result of the first temperature sensing operation.

The program component 550 may perform a program operation by applying the decided program voltage to a word line.

The temperature comparator 570 may compare the first temperature sensing result with the second temperature sensing result. If the difference between the two temperature sensing results is equal to or greater than a threshold, the temperature comparator 570 may decide the result of the program operation as a failure.

The verify component 590 may decide the verify voltage based on the first temperature sensing result and perform a verification operation by applying the verify voltage to a word line.

Figure 6A:
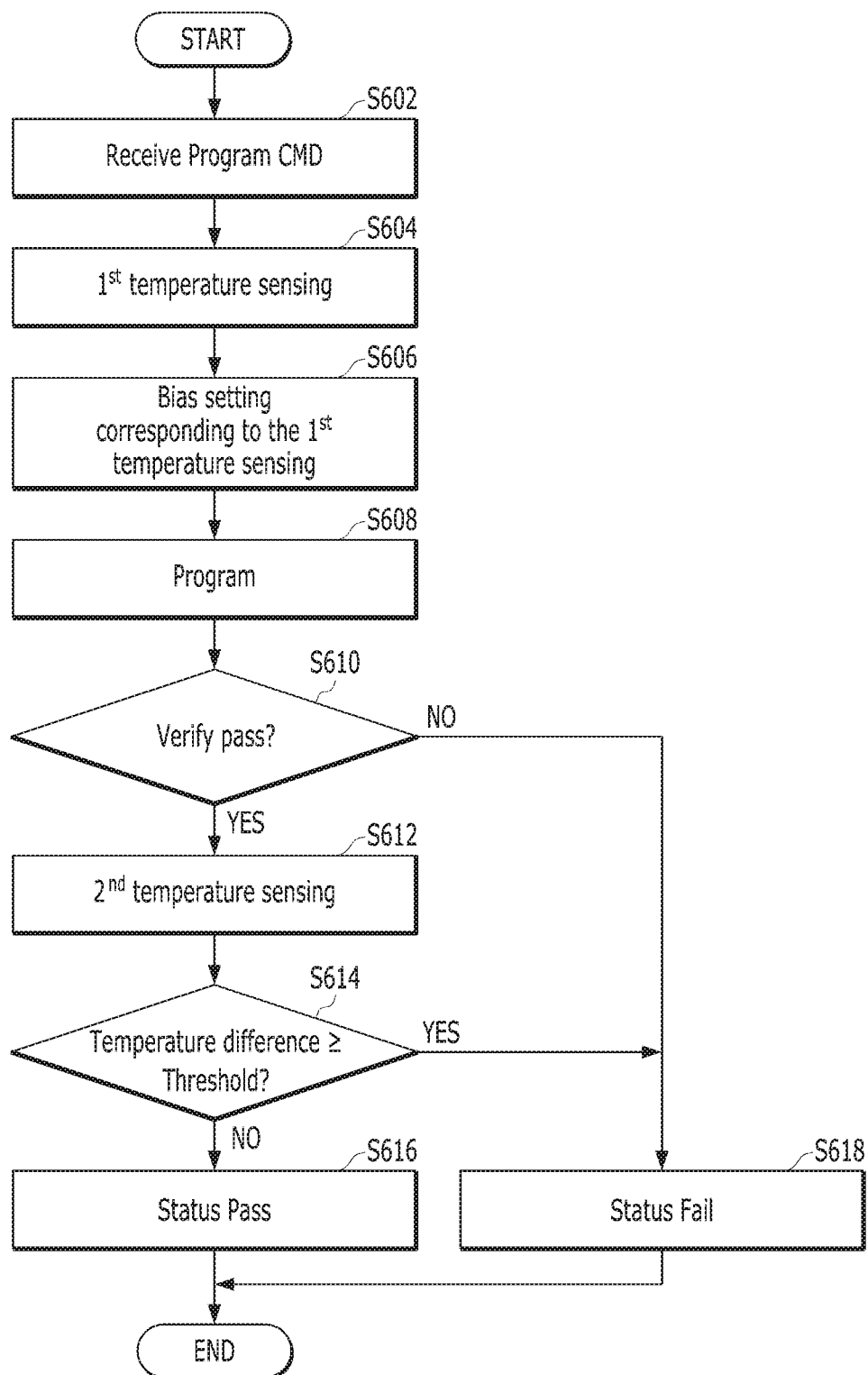
FIGS. 6A to 6D are flowcharts illustrating an operation of a memory system in accordance with an embodiment of the present invention.

FIG. 6A is a flowchart illustrating an operation of the memory system 110 in accordance with an embodiment of the present invention.

FIG. 6A, at step S602, the memory device 150 may receive a program command, a memory address for executing the program, and program data to be programmed from the controller 130.

At step S604, the temperature sensor 510 may perform a first temperature sensing operation for measuring the internal temperature of the memory device 150 in order to program the data according to the program command.

At step S606, the bias setter 530 may decide bias voltages such as the program voltage and the verify voltage based on the result of the first temperature sensing operation.

At step S608, the program component 550 may perform the program operation by applying the decided program voltage to a word line.

At step S610, the verify component 590 may perform a verification operation with respect to the result of the program operation by applying the decided verify voltage to the word line. In other words, the verify component 590 may decide whether the program operation was successful or not.

When it is decided as a result of the verification operation that the program operation failed ("NO" at step S610), the verify component 590 may provide a program failure signal, e.g., a status fail signal, to the controller 130 in step S618.

Subsequently, in response to the program fail signal, the controller 130 may decide that the memory block having the memory address associated with the program fail is a bad memory block.

Also, the controller 130 may provide a new memory address in response to the program failure signal, and the memory device 150 may perform the operation from the step S604 again.

When it is decided as a result of the verification operation that the program operation passed ("YES" at step S610), the temperature sensor 510 may perform a second temperature sensing operation at step S612. The second temperature sensing operation measures the internal temperature of the memory device 150 in order to decide whether the program operation and the verification operation are performed based on the correct temperature.

At step S614, the temperature comparator 570 may compare the result of the first temperature sensing operation with the result of the second temperature sensing operation.

Since the operation time of the steps S604 to S612 is as short as hundreds of microseconds ($\mu s$) to several milliseconds (ms), it may be assumed that the internal temperature of the memory device 150 changes very little, if at all, between the time of the first temperature sensing operation and the time of the second temperature sensing operation.

Therefore, when the difference between the result of the first temperature sensing operation and the result of the second temperature sensing operation is greater than or equal to the threshold value, at least one of the temperature sensing operation results may be inaccurate. In other words, in the above case, the verify component 590 may have made a wrong decision on whether the program operation passed or not at step S610, by performing the verification operation based on the incorrect temperature.

Accordingly, when the difference between the result of the first temperature sensing operation and the result of the second temperature sensing operation is greater than or equal to the threshold value ("YES" at the step S614), the temperature comparator 570 may provide a program failure signal to the controller 130 at step S618.

When the failure of the program operation is not caused due to a defect in the memory block itself but due to a malfunction of the temperature sensor 510, and the controller 130 receives the program failure signal as the result of the temperature comparison operation at the step S614, the controller 130 may not decide that the memory block having the memory address associated with the program operation is a bad memory block, but use the memory block continuously.

In an embodiment, when the difference between the result of the first temperature sensing operation and the result of the second temperature sensing operation is greater than or equal to the threshold value ("YES" at the step S614), the temperature comparator 570 may transfer a flag signal to the controller 130 together with the program failure signal. Thus, the controller 130 does not decide that the memory block is a bad memory block based on the flag signal. Also, the controller 130 may provide a new memory address to the memory device 150, and the memory device 150 may perform the operation based on the new memory address from the step S604 again.

If the difference in the temperature sensing result is less than the threshold value ("NO" at step S614), the temperature comparator 570 may provide the program pass signal as a status pass signal to the controller 130 at step S616, which may then be provided by the controller 130 to the host 102.

Figure 6B:
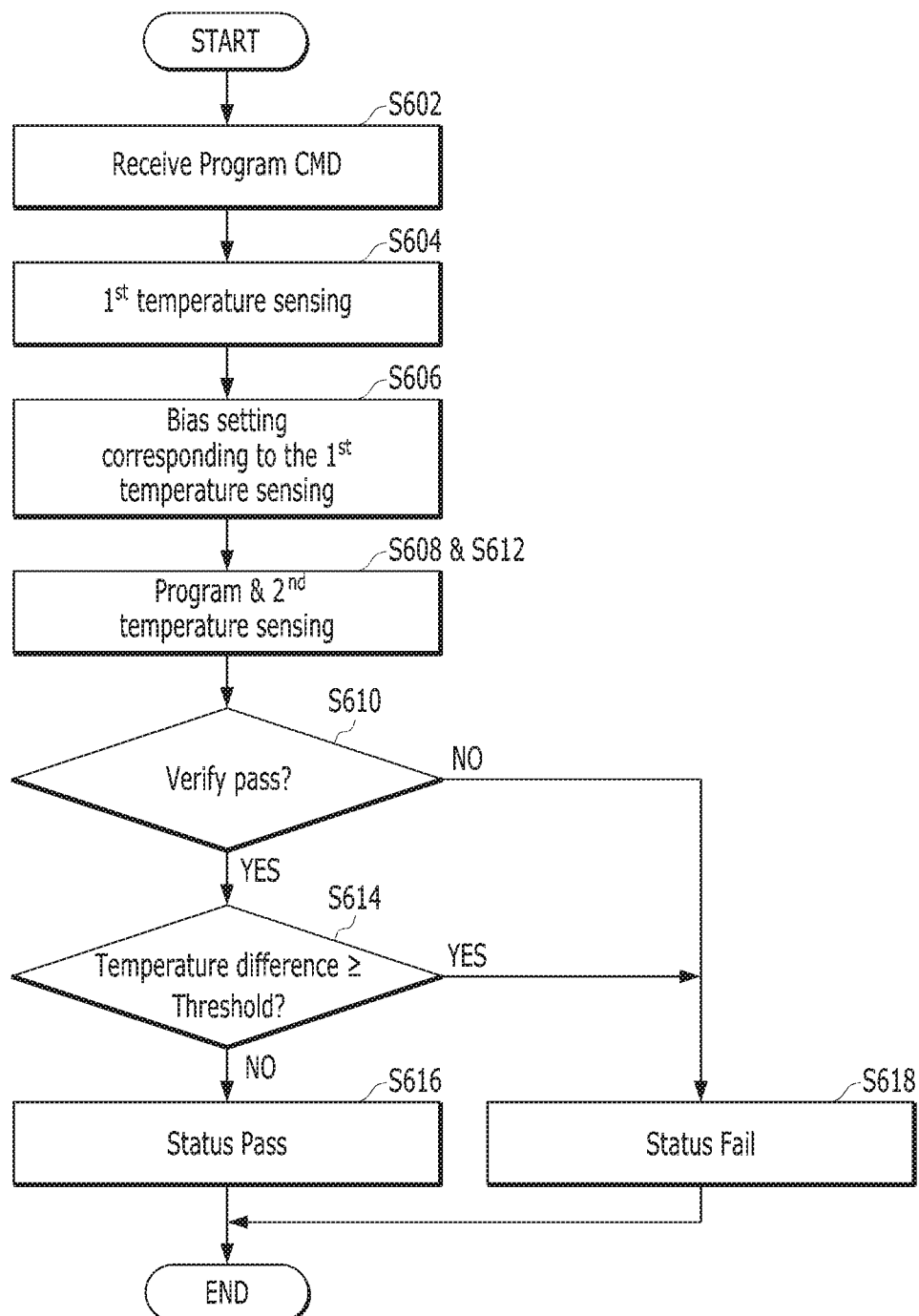

FIG. 6B is a flowchart illustrating an operation of the memory system 110 in accordance with an embodiment of the present invention.

The operations of the steps S602 to S606 may be the same as described above with reference to FIG. 6A.

Referring to FIG. 6B, the operations of the steps S608 and S612 described with reference to FIG. 6A may be performed simultaneously. In other words, while the program component 550 performs the program operation, the temperature sensor 510 may perform the second temperature sensing operation. According to an embodiment of the present invention, performing the second temperature sensing operation in a time period that coincides or overlaps with the time period in which the program operation is performed may improve the performance of the memory system 110.

The operations of the step S610 and the steps S614 to S618 are as described with reference to FIG. 6A.

Figure 6C:
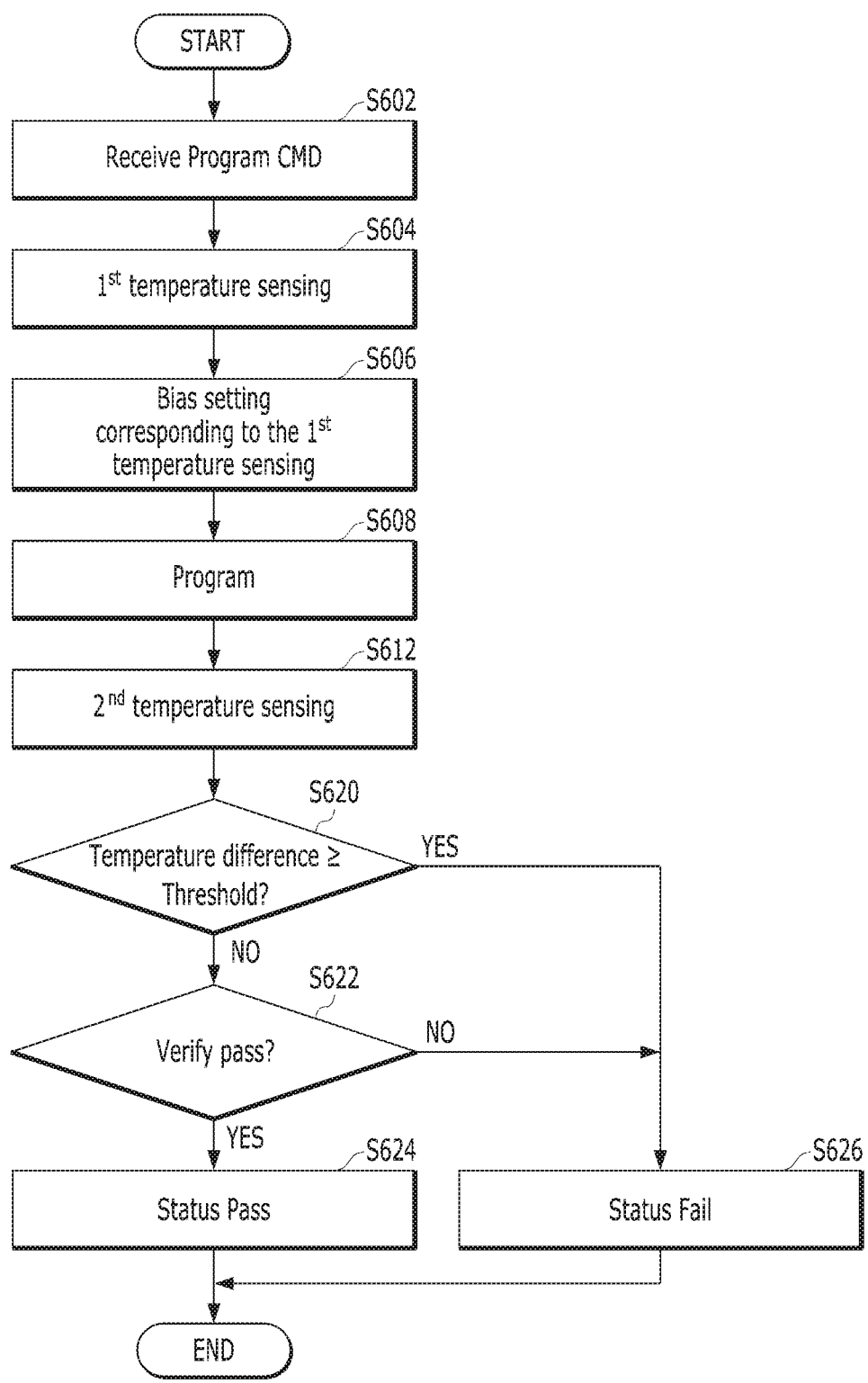

FIG. 6C is a flowchart illustrating an operation of the memory system 110 in accordance with an embodiment of the present invention.

Referring to FIG. 6C, the operations of the steps S602 to S608 are as described with reference to FIG. 6A.

At step S612, the temperature sensor 510 may perform the second temperature sensing operation.

At step S620, the temperature comparator 570 may compare the result of the first temperature sensing operation with the result of the second temperature sensing operation.

When the difference between the result of the first temperature sensing operation and the result of the second temperature sensing operation is greater than or equal to the threshold value, at least of the two temperature sensing results may be inaccurate. In other words, in the above case, the verify component 590 may perform a verification operation based on an incorrect temperature, and thus the verify component 590 may make a wrong decision on whether the program operation passed or not at step S622.

Therefore, when the difference between the result of the first temperature sensing operation and the result of the second temperature sensing operation is greater than or equal to the threshold value ("YES" at the step S620), at step S626, the temperature comparator 570 may provide the program failure signal to the controller 130. The temperature comparator 570 may provide the flag signal together with the program failure signal to the controller 130 so that the controller 130 does not decide that the memory block including the memory address is a bad memory block.

Also, the controller 130 may provide a new memory address in response to the program failure signal, and the memory device 150 may perform the operation from step S604 again.

When the difference between the result of the first temperature sensing operation and the result of the second temperature sensing operation is less than the threshold value ("NO" at the step S620), the verify component 590 may perform a verification operation with respect to the result of the program operation by applying a verify voltage to a word line based on the result of the first temperature sensing operation.

When it is decided from the verification operation that the program operation passed ("YES" at the step S622), the verify component 590 may provide the program pass signal as a status pass signal to the controller 130 at step S624.

When it is decided from the verification operation that the program operation failed ("NO" at the step S622), the verify component 590 may provide a program failure signal as a status fail signal to the controller 130 at step S626.

Subsequently, the controller 130 may decide that the memory block including the memory address in response to the program failure signal is a bad memory block. Also, the controller 130 may provide a new memory address, and the memory device 150 may perform the operation from the step S604 again.

Figure 6D:
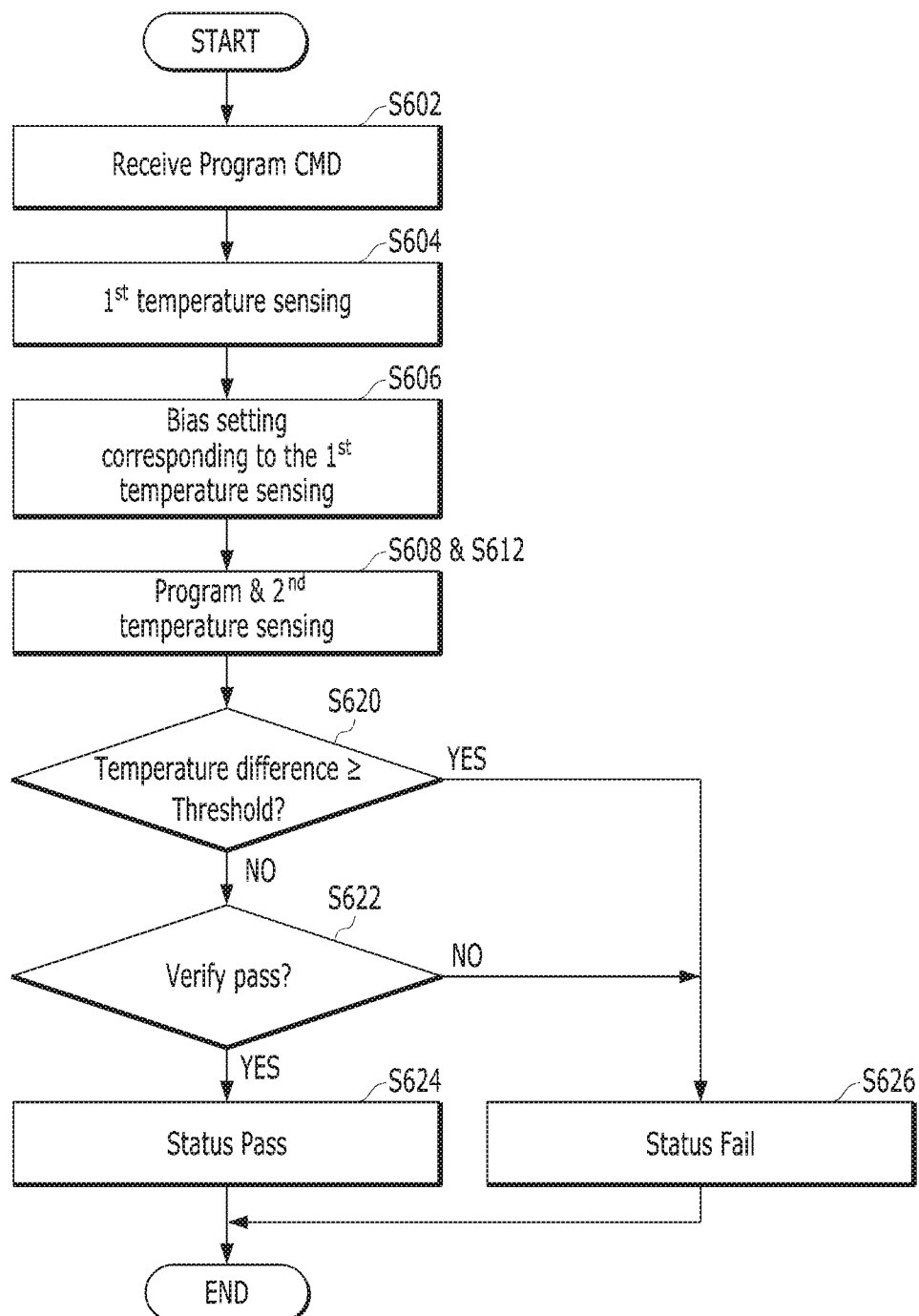

FIG. 6D is a flowchart illustrating an operation of the memory system 110 in accordance with an embodiment of the present invention.

Referring to FIG. 6D, the operations of the steps S602 to S606 are as described with reference to FIG. 6A.

The operations of steps S608 and S612 described with reference to FIG. 6A may be performed simultaneously. In other words, while the program component 550 performs the program operation, the temperature sensor 510 may perform the second temperature sensing operation.

The operations of the steps S620 to S626 are as described with reference to FIG. 6C.

According to embodiments of the present invention described above, when a program operation and a verification operation are performed based on inaccurate temperature information obtained from malfunction of the temperature sensor 510, it is possible to prevent making a decision that the program operation passed by checking out whether the result of the first temperature sensing operation is an accurate result or not based on the result of the second temperature sensing operation.

Referring to FIGS. 7 to 15, a data processing system and electronic devices, to which the memory system 110 including the memory device 150 and the controller 130 described above with reference to FIGS. 1 to 6D may be applied, is described below in detail.

Figure 7:
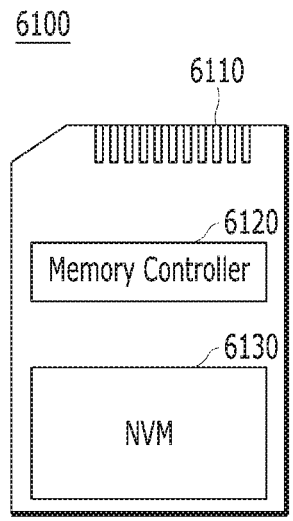
FIGS. 7 to 15 are diagrams illustrating exemplary applications of a data processing system in accordance with various embodiments of the present invention.

FIG. 7 is a diagram schematically illustrating a data processing system including the memory system in accordance with an embodiment. FIG. 7 schematically illustrates a memory card system 6100 to which the memory system in accordance with an embodiment is applied.

Referring to FIG. 7, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a random access memory (RAM), a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), advanced technology attachment (ATA), serial-ATA, parallel-ATA, small computer system interface (SCSI), enhanced small disk interface (EDSI), integrated drive electronics (IDE), Firewire, universal flash storage (UFS), WIFI and Bluetooth. Thus, the memory system and the data processing system in accordance with an embodiment may be applied to wired/wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may form a memory card such as a personal computer (PC) card (personal computer memory card international association (PCMCIA)), a compact flash (CF) card, a smart media card (e.g., SM and SMC), a memory stick, a multimedia card (e.g., MMC, RS-MMC, MMCmicro and eMMC), a secure digital (SD) card (e.g., SD, miniSD, microSD and SDHC) and/or a universal flash storage (UFS).

Figure 8:
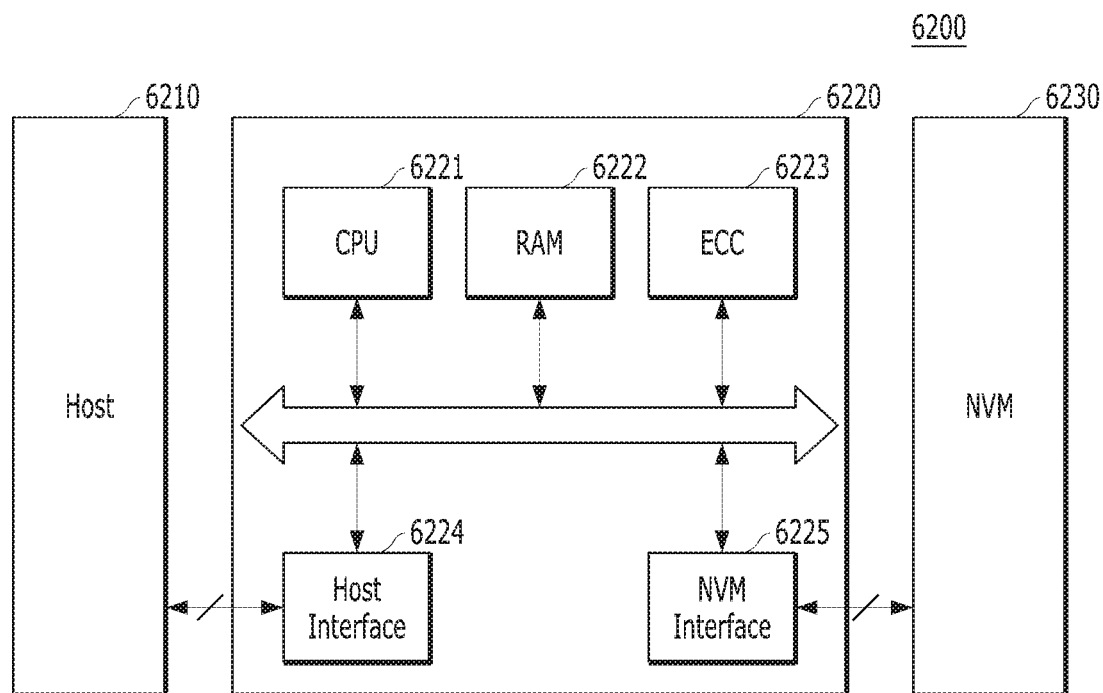

FIG. 8 is a diagram schematically illustrating a data processing system 6200 including the memory system in accordance with an embodiment.

Referring to FIG. 8, the data processing system 6200 may include a memory device 6230 having one or more nonvolatile memories (NVMs) and a memory controller 6220 for controlling the memory device 6230. The data processing system 6200 illustrated in FIG. 8 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 operating at low speed to operate at high speed.

The ECC circuit 6223 may correspond to the ECC component 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may exchange data with the host 6210 through the host interface 6224, and exchange data with the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or long term evolution (LTE). The memory controller 6220 may be connected to an external device, for example, the host 6210 or another external device, and then exchange data with the external device. In particular, as the memory controller 6220 is configured to communicate with the external device through one or more of various communication protocols, the memory system and the data processing system in accordance with an embodiment may be applied to wired/wireless electronic devices, particularly a mobile electronic device.

Figure 9:
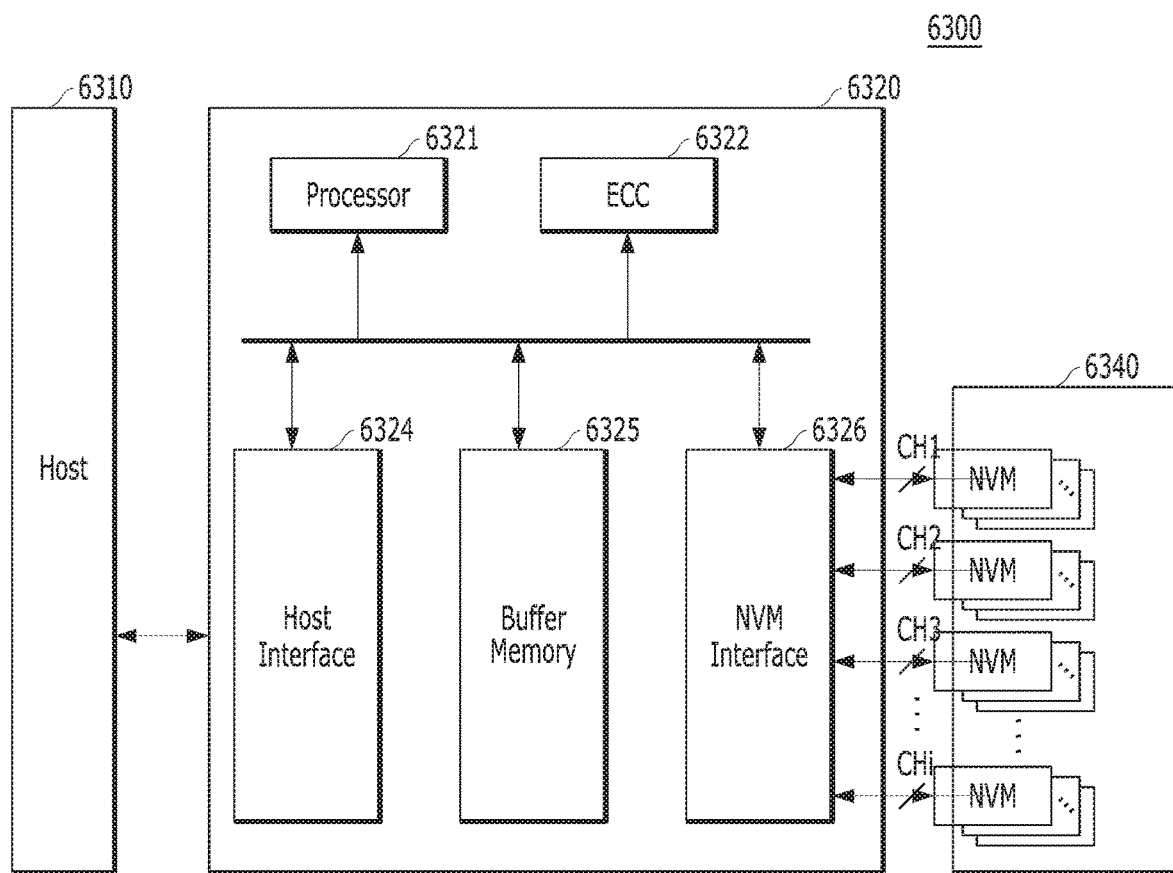

FIG. 9 is a diagram schematically illustrating a data processing system including the memory system in accordance with an embodiment. FIG. 9 illustrates a solid state drive (SSD) 6300 to which the memory system may be applied.

Referring to FIG. 9, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an error correction code (ECC) circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by any of various volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). By way of example, FIG. 9 illustrates that the buffer memory 6325 is disposed in the controller 6320. However, the buffer memory 6325 may be external to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 10:
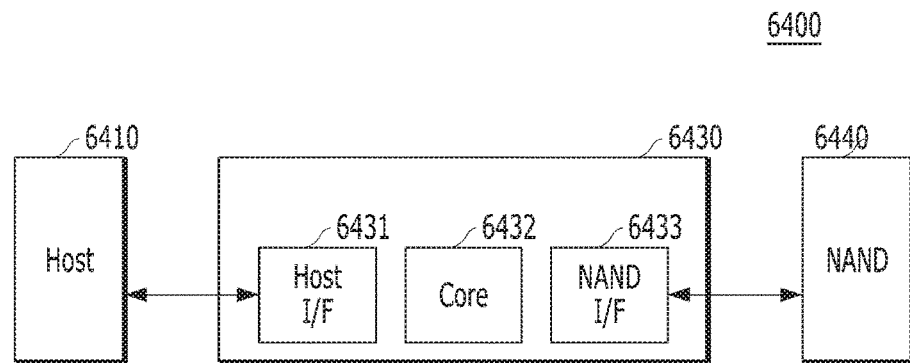

FIG. 10 is a diagram schematically illustrating a data processing system including the memory system in accordance with an embodiment. FIG. 10 schematically illustrates an embedded multi-media card (eMMC) 6400 to which the memory system may be applied.

Referring to FIG. 10, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS)-I and UHS-II interface.

FIGS. 11 to 14 are diagrams schematically illustrating other exemplary applications of a data processing system including the memory system in accordance with one or more embodiments. FIGS. 11 to 14 schematically illustrate universal flash storage (UFS) systems to which the memory system may be applied.

Referring to FIGS. 11 to 14, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices, particularly mobile electronic devices. The UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices, particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 8 to 10, and the UFS cards 6530, 6630, 6730 and 6830 may be embodied in the form of the memory card system 6100 described with reference to FIG. 7.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI unified protocol (UniPro) in mobile industry processor interface (MIPI). Furthermore, the UFS devices 6520, 6620, 6720 and 6820 and the UFS cards 6530, 6630, 6730 and 6830 may communicate with each other through various protocols other than the UFS protocol, for example, universal storage bus (USB) Flash Drives (UFDs), multi-media card (MMC), secure digital (SD), mini-SD, and micro-SD.

Figure 11:
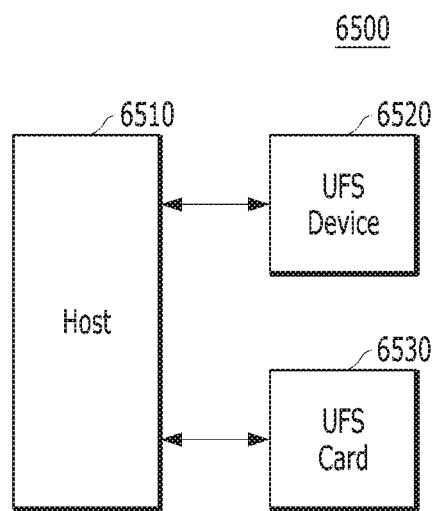

In the UFS system 6500 illustrated in FIG. 11, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment of FIG. 11, the configuration in which one UFS device 6520 and one UFS card 6530 are connected to the host 6510 is illustrated as an example. However, in another embodiment, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 12:
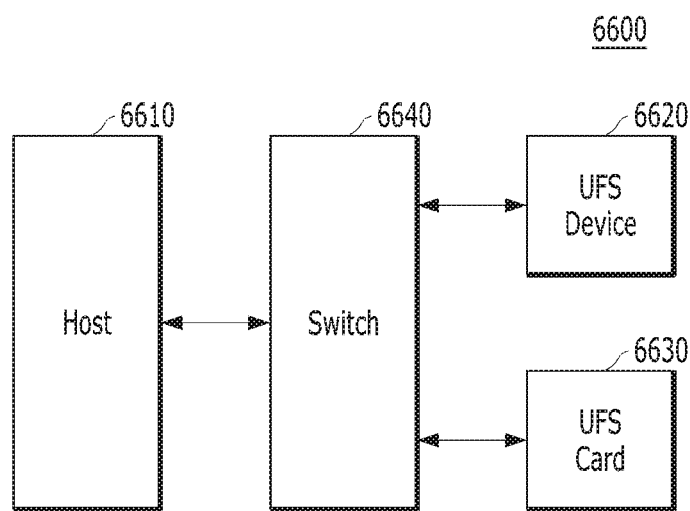

In the UFS system 6600 illustrated in FIG. 12, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment of FIG. 12, the configuration in which one UFS device 6620 and one UFS card 6630 are connected to the switching module 6640 is illustrated as an example. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 13:
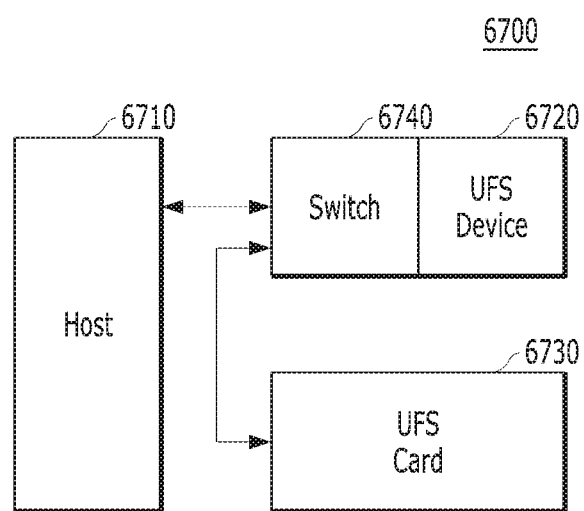

In the UFS system 6700 illustrated in FIG. 13, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the embodiment of FIG. 13, the configuration in which one UFS device 6720 and one UFS card 6730 are connected to the switching module 6740 is illustrated as an example. However, in another embodiment, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 14:
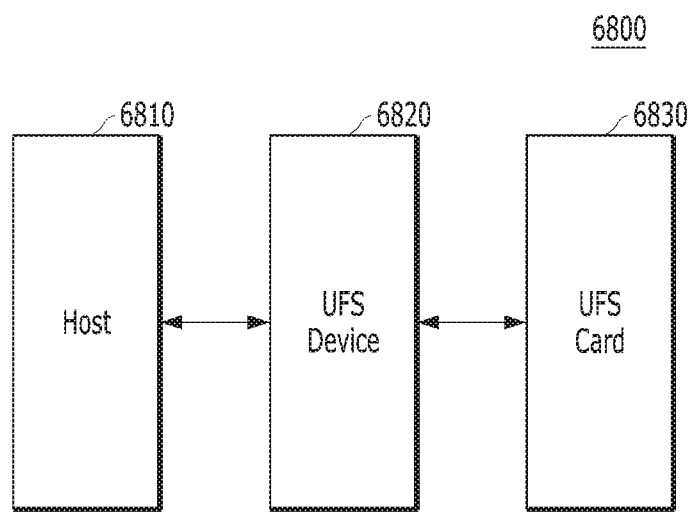

In the UFS system 6800 illustrated in FIG. 14, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. The host 6810 and the UFS card 6830 may communicate with each other through target ID switching between the M-PHY and UniPro modules of the UFS device 6820. In the embodiment of FIG. 14, the configuration in which one UFS device 6820 is connected to the host 6810 and one UFS card 6830 is connected to the UFS device 6820 is illustrated as an example. However, in another embodiment, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 15:
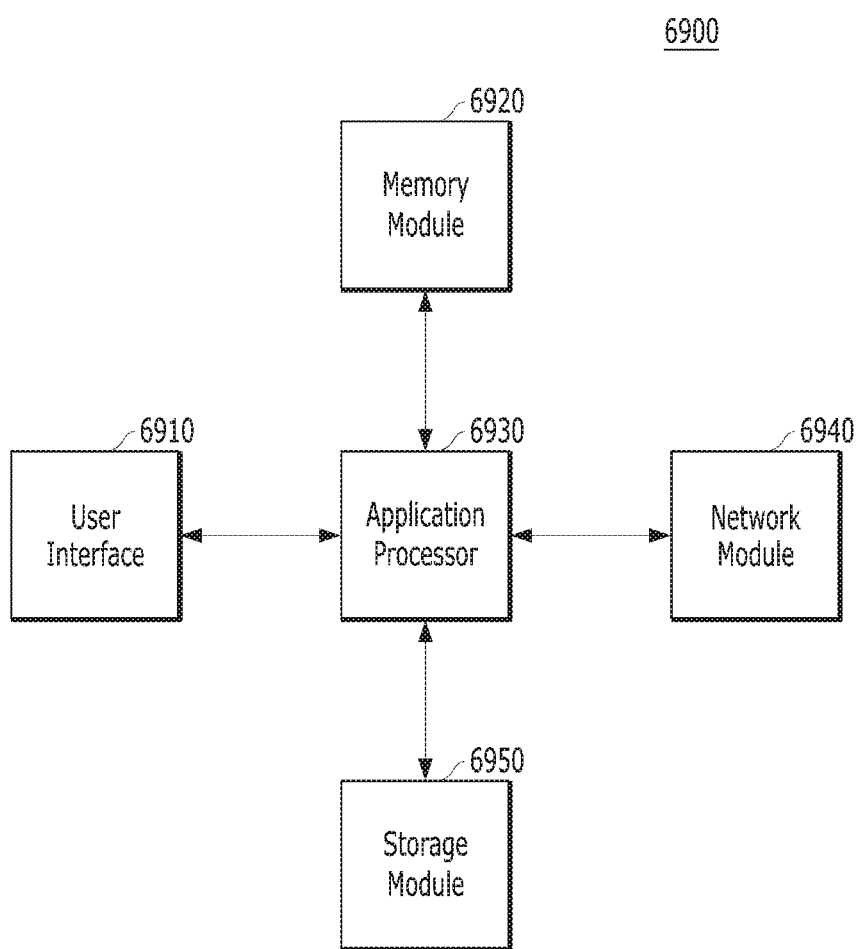

FIG. 15 is a diagram schematically illustrating a data processing system including the memory system in accordance with an embodiment. FIG. 15 is a diagram schematically illustrating a user system 6900 to which the memory system may be applied.

Referring to FIG. 15, the user system 6900 may include an application processor 6930, a memory module 6920, a network module 6940, a storage module 6950 and a user interface 6910.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as a solid state drive (SSD), embedded multimedia card (eMMC) and universal flash storage (UFS) as described above with reference to FIGS. 9 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to embodiments of the present invention, a memory device and a method for operating the memory device are capable of improving the reliability of stored data even when an internal thermo-sensor malfunctions.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A method for operating a memory device, comprising:
   receiving a program command, a memory address, and a program data from a controller;
   performing a first temperature sensing operation for measuring an internal temperature to produce a first result of the first temperature sensing operation;
   performing a program operation on the program data based on the first result of the first temperature sensing operation;
   performing a second temperature sensing operation for measuring an internal temperature to produce a first result of the second temperature sensing operation; and
   performing a temperature comparison operation for deciding whether the program operation failed when a difference between the first result of the first temperature sensing operation and the first result of the second temperature sensing operation is greater than or equal to a threshold value.

2. The method of claim 1, further comprising:
   performing a verification operation with respect to the result of the program operation based on the first result of the first temperature sensing operation to produce a verification result, when the difference between the first result of the first temperature sensing operation and the first result of the second temperature sensing operation is less than the threshold value.

3. The method of claim 1, further comprising:
   performing a verification operation with respect to the result of the program operation based on the first result of the first temperature sensing operation to produce a verification result, before performing the temperature comparison operation; and
   performing the temperature comparison operation when the verification result indicates that the program operation passed.

4. The method of claim 1, wherein the performing of the program operation on the program data based on the first result of the first temperature sensing operation includes:
   applying a program voltage decided based on the first result of the first temperature sensing operation to a word line.

5. The method of claim 1, further comprising:
   receiving a new memory address from the controller, after performing the temperature comparison operation;
   performing the first temperature sensing operation again to produce a second result of the first temperature sensing operation;
   performing a program operation on the program data based on the second result of the first temperature sensing operation;
   performing the second temperature sensing operation again to produce a second result of the second temperature sensing operation; and
   performing a temperature comparison operation based on the second result of the first temperature sensing operation and the second result of the second temperature sensing operation.

6. The method of claim 1, wherein the second temperature sensing operation is performed while performing the program operation.

* * * * *